United States Patent
Farquhar et al.

(10) Patent No.: US 10,590,529 B2
(45) Date of Patent: Mar. 17, 2020

(54) METAL FOAMS AND METHODS OF MANUFACTURE

(71) Applicant: Fourté International, Sdn. Bhd., Bayan Lepas, Penang (MY)

(72) Inventors: James J. Farquhar, Penang (MY); Choon Ming Seah, Penang (MY)

(73) Assignee: Fourté International, SDN. BHD, Bayan Lepas (MY)

( * ) Notice: Subject to any disclaimer, the term of this patent is extended or adjusted under 35 U.S.C. 154(b) by 64 days.

(21) Appl. No.: 15/954,480

(22) Filed: Apr. 16, 2018

(65) Prior Publication Data

US 2018/0230590 A1    Aug. 16, 2018

Related U.S. Application Data

(63) Continuation-in-part of application No. 14/947,951, filed on Nov. 20, 2015, now Pat. No. 9,945,027.

(51) Int. Cl.
*B22F 3/11* (2006.01)
*B22F 3/24* (2006.01)
(Continued)

(52) U.S. Cl.
CPC ............ *C23C 16/01* (2013.01); *B22F 3/1055* (2013.01); *B22F 3/1121* (2013.01); *B22F 3/24* (2013.01);
(Continued)

(58) Field of Classification Search
CPC .. B22F 2999/00; B22F 7/002; B22F 2998/10; B22F 3/1055; B22F 3/1121; B22F 3/24; B22F 7/06; C22C 1/04; C22C 1/08; C22C 2026/002; C23C 14/205; C23C 16/01; C23C 16/045; C23C 16/26; C23C 16/545;
(Continued)

(56) References Cited

U.S. PATENT DOCUMENTS 3,946,039 A * 3/1976 Walz .................... B22F 3/1121
                                                    264/628
4,207,278 A * 6/1980 Cowen ................... B29C 44/16
                                                    264/46.4
(Continued)

FOREIGN PATENT DOCUMENTS

KR    20150071779    6/2015
WO    WO2014118547    8/2014
(Continued)

OTHER PUBLICATIONS

Cesare "Physicists Announce Graphene's Latest Cousin: Stanene," Nature, 2015, vol. 524, p. 18.
(Continued)

*Primary Examiner* — Alexander M Weddle
(74) *Attorney, Agent, or Firm* — Keith Kline; The Kline Law Firm PC

(57) ABSTRACT

Embodiments of the present technology include metal foams and methods of manufacture. An example method of creating a porous metal foam includes mixing an amount of a metallic powder with an amount of sacrificial particles in a specified ratio to create a mixture; and applying pressure to the mixture that is sufficient to: compact the mixture; decompose or dissolve the sacrificial particles; and fuse the metallic powder into the porous metal foam.

15 Claims, 16 Drawing Sheets

1200

Mixing an amount of a metallic powder with an amount of sacrificial particles in a specified ratio to create a mixture
1202

Applying pressure to the mixture that is sufficient to compact the mixture, decompose the sacrificial particles, and fuse the metallic powder into the porous metal foam
1204

Annealing the porous metal foam at an annealing temperature
1206

(51) Int. Cl.

| | | |
|---|---|---|
| C23C 16/01 | (2006.01) | |
| C23C 16/26 | (2006.01) | |
| C23C 16/04 | (2006.01) | |
| C22C 1/04 | (2006.01) | |
| C23C 16/54 | (2006.01) | |
| B22F 3/105 | (2006.01) | |
| C23C 14/20 | (2006.01) | |
| C22C 1/08 | (2006.01) | |
| H01M 4/02 | (2006.01) | |
| H01M 4/04 | (2006.01) | |
| B22F 7/00 | (2006.01) | |
| B22F 5/00 | (2006.01) | |
| H01M 2/16 | (2006.01) | |
| H01M 8/04082 | (2016.01) | |
| B22F 7/06 | (2006.01) | |
| C22C 26/00 | (2006.01) | |

(52) U.S. Cl.
CPC .......... *C22C 1/04* (2013.01); *C22C 1/08* (2013.01); *C23C 14/205* (2013.01); *C23C 16/045* (2013.01); *C23C 16/26* (2013.01); *C23C 16/545* (2013.01); *B22F 3/1134* (2013.01); *B22F 5/007* (2013.01); *B22F 7/002* (2013.01); *B22F 7/06* (2013.01); *B22F 2003/248* (2013.01); *B22F 2201/20* (2013.01); *B22F 2202/06* (2013.01); *B22F 2998/10* (2013.01); *B22F 2999/00* (2013.01); *C22C 2026/002* (2013.01); *H01M 2/1646* (2013.01); *H01M 4/0402* (2013.01); *H01M 8/04216* (2013.01); *H01M 2004/021* (2013.01)

(58) Field of Classification Search
CPC ......... H01M 2004/021; H01M 2/1646; H01M 4/0402; H01M 8/04216
See application file for complete search history.

(56) References Cited

U.S. PATENT DOCUMENTS

| | | | |
|---|---|---|---|
| 4,900,368 A * | 2/1990 | Brotz | ............. G21H 1/06 136/253 |
| 4,957,543 A | 9/1990 | Babjak et al. | |
| 5,151,246 A * | 9/1992 | Baumeister | ........... B22F 3/1125 264/44 |
| 8,785,079 B1 | 7/2014 | Gross et al. | |
| 2006/0118984 A1* | 6/2006 | Farber | ................. B22F 3/1125 264/44 |
| 2009/0176082 A1 | 7/2009 | Kuczynski | |
| 2011/0048625 A1 | 3/2011 | Caldwell et al. | |
| 2011/0070488 A1 | 3/2011 | West et al. | |
| 2011/0286147 A1 | 11/2011 | Chen et al. | |
| 2012/0028798 A1 | 2/2012 | Worsley et al. | |
| 2012/0273255 A1 | 11/2012 | Hemond et al. | |
| 2013/0021718 A1 | 1/2013 | Yager | |
| 2013/0248229 A1 | 9/2013 | Martens | |
| 2013/0280593 A1 | 10/2013 | Hashimoto et al. | |
| 2013/0319973 A1 | 12/2013 | Tour et al. | |
| 2013/0321111 A1* | 12/2013 | O'Brien | ................. H01F 13/003 335/284 |
| 2014/0110049 A1 | 4/2014 | Yuen et al. | |
| 2014/0209168 A1 | 7/2014 | Zhamu et al. | |
| 2016/0019995 A1 | 1/2016 | Zhamu et al. | |
| 2016/0090653 A1* | 3/2016 | Jensen | ................. B22F 3/1134 427/244 |
| 2017/0145561 A1 | 5/2017 | Farquhar et al. | |

FOREIGN PATENT DOCUMENTS

| | | |
|---|---|---|
| WO | WO2014141071 | 9/2014 |
| WO | WO2015132764 | 9/2015 |
| WO | WO2017087196 | 5/2017 |
| WO | WO2017087240 | 5/2017 |

OTHER PUBLICATIONS

Kim, et al., "Strengthening Effect of Single-Atomic-Layer Graphene in Metal-Graphene Nanolayered Composites," Nature Communications, 2013, vol. 4 (2114), pp. 1-7.

Saxena, et al., "Stanene: Atomically Thick Free-Standing Layer of 2D Hexagonal Tin," arXiv:1505.05062 [cond-mat.mtrl-sci], 2015, vol. 6, pp. 5.

Search Repor and Written Opiniont dated Jan. 9, 2017 for PCT Application No. PCT/US2016/060853.

Search Report and Written Opinion dated Mar. 10, 2017 for PCT Application No. PCT/US2016/061265.

Wang et al., "Three Dimensional Few Layer Graphene and Carbon Nanotube Foam Architectures for High Fidelity Supercapacitors," Nano Engergy, 2013, vol. 2 (2), pp. 294-303.

* cited by examiner

1200

```
┌─────────────────────────────────────────────────────────────────────────┐
│ Mixing an amount of a metallic powder with an amount of sacrificial     │
│ particles in a specified ratio to create a mixture                      │
│                                 1202                                    │
└─────────────────────────────────────────────────────────────────────────┘
                                    ↓
┌─────────────────────────────────────────────────────────────────────────┐
│ Applying pressure to the mixture that is sufficient to compact the      │
│ mixture, decompose the sacrificial particles, and fuse the metallic     │
│ powder into the porous metal foam                                       │
│                                 1204                                    │
└─────────────────────────────────────────────────────────────────────────┘
                                    ↓
┌─────────────────────────────────────────────────────────────────────────┐
│ Annealing the porous metal foam at an annealing temperature             │
│                                 1206                                    │
└─────────────────────────────────────────────────────────────────────────┘
```

FIG. 12

METAL FOAMS AND METHODS OF MANUFACTURE

CROSS-REFERENCE TO RELATED APPLICATIONS

This application is a continuation-in-part of U.S. application Ser. No. 14/947,951, filed on Nov. 20, 2015, which is hereby incorporated by reference herein in its entirety, including all references and appendices cited therein, for all purposes.

FIELD OF THE PRESENT TECHNOLOGY

The present technology relates generally to manufacturing methods, and more particularly but not by limitation, to methods that produce a graphene-metal composite or a stanene-metal composite or graphene nanofoam to provide substantial heat and electrical transfer properties from materials such as graphene or stanene deposited on porous metal foam followed by compression to increase heat and electrical transfer properties.

SUMMARY

Embodiments of the present technology include a graphene-metal composite comprising: a porous metal foam substrate and a graphene layer deposited to the porous metal foam substrate, the porous metal foam substrate with graphene being compressed into a graphene-metal composite. Another embodiment of the present technology includes a stanene-metal composite comprising: a porous metal foam substrate and a stanene layer deposited to the porous metal foam substrate, the porous metal foam substrate with stanene being compressed into a stanene-metal composite.

In some embodiments, the graphene-metal composite or stanene-metal composite can be manufactured by depositing graphene or stanene onto a porous metal foam substrate and compressing the porous metal foam substrate with graphene or stanene applied to form a graphene-metal composite or stanene-metal composite. In some embodiments, graphene or stanene is deposited onto the porous metal foam substrate by chemical vapor deposition.

Other embodiments of the present technology include a graphene-metal composite comprising: a porous metal foam substrate; a graphene layer deposited to the porous metal foam substrate; a metal layer applied to the graphene layer; and another graphene layer deposited to the metal layer, the multilayered porous metal foam substrate being compressed to form a graphene-metal composite. Another embodiment of the present technology includes a stanene-metal composite comprising: a porous metal foam substrate; a stanene layer deposited to the porous metal foam substrate; a metal layer applied to the stanene layer; and another stanene layer deposited to the metal layer, the multilayered porous metal foam substrate being compressed to form a stanene-metal composite.

In some embodiments, the graphene-metal composite or stanene-metal composite can be manufactured by depositing a layer of graphene or stanene onto a porous metal foam substrate; applying a layer of metal on top of the layer of graphene or stanene; depositing another layer of graphene or stanene onto the layer of metal; and compressing the multilayered porous metal foam substrate to form a graphene-metal composite or stanene-metal composite.

Some embodiments are directed to a method of creating a porous metal foam, comprising: mixing an amount of a metallic powder with an amount of sacrificial particles in a specified ratio to create a mixture; and applying pressure to the mixture that is sufficient to: compact the mixture; decompose or dissolve the sacrificial particles; and fuse the metallic powder into the porous metal foam Various embodiments are directed to a method comprising: providing a mold having a cavity; placing or direct three-dimensional printing of sacrificial particulates in the cavity of the mold in such a way that a matrix is formed having voids; applying pressure to the sacrificial particulates while the sacrificial particulates are inside the cavity; depositing a metal onto the sacrificial particulates using any of chemical vapor deposition, physical vapor deposition, or electroless or electrolytic plating; and vaporizing the sacrificial particulates or diluting the sacrificial particulates with a chemical solvent to reveal a metal foam.

One or more embodiments are directed to a method comprising: providing a metal foam having a matrix with voids; depositing a layer of graphene on outer surfaces of the metal foam; and removing the metal foam such that a graphene nanofoam remains.

BRIEF DESCRIPTION OF THE DRAWINGS

FIG. 12 is a flowchart of an example method for producing a metal foam using loss carbon sintering.

DETAILED DESCRIPTION

Figure 1A:
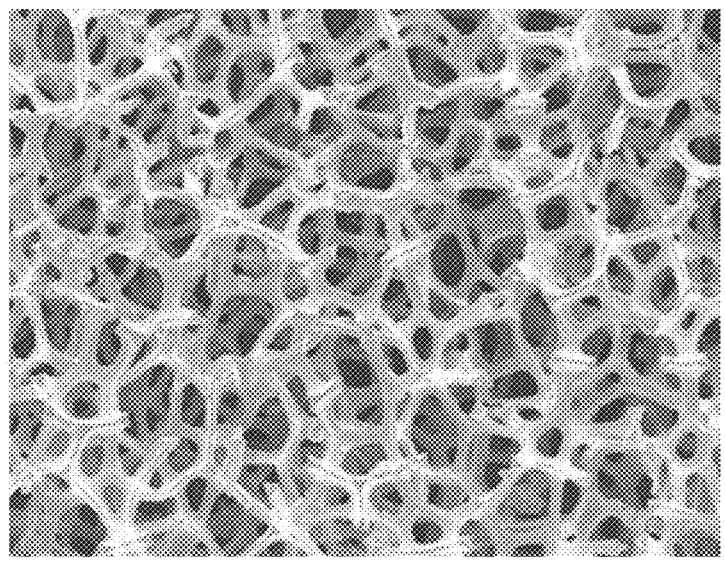
FIG. 1A is a SEM (scanning electron microscope) micrograph of a nickel foam structure.

In the following description, for purposes of explanation and not limitation, specific details are set forth, such as particular embodiments, procedures, techniques, etc. in order to provide a thorough understanding of the present invention. However, it will be apparent to one skilled in the art that the present invention may be practiced in other embodiments that depart from these specific details.

The present disclosure is directed to graphene-metal composites, stanine-metal composites and methods of manufacture. Graphene is the strongest material, best electrical conductor, and is very light weight. Graphene can be used in various applications such as batteries for electric drive automobiles, filter material for water filters, bendable LCD screens for consumer electronics, nanoelectronics, or light weight body panels for commercial aircrafts. Production techniques for graphene and components and systems integrating graphene are growing rapidly.

Stanene is an ultrathin superconductor. Stanene could be integrated into computer chips at critical junctions to improve speed and energy efficiency.

Since graphene is a two dimensional layer of carbon atoms only one carbon thick and stanene is a two dimensional single layer of tin atoms with the possible addition of fluorine atoms, graphene and stanene have large surface to volume ratios and very little capacity because they are so thin. However, because graphene transmits heat very efficiently, it is desirable to use graphene as a thermal heat sink in order to dissipate heat. When graphene is layered upon another layer of graphene, it forms graphite which is very brittle and less conductive. There is a need to solve the problem of increasing thermal and electrical capacity of graphene. Stanene, comprised of the heavy atom tin, may be a topological insulator and 100% efficient in the transfer of electrons at or above room temperature. Moreover, by adding fluorine atoms to the tin structure, stanene may be super conductive at around the boiling point of water.

In the present technology, graphene is deposited onto a porous metal foam substrate, for example, by chemical vapor deposition. An alternative material, stanene, may be used in place of graphene throughout the present technology. Any metal foam may be used in the present technology, including, but not limited to, nickel foam and copper foam. In some embodiments, chemical vapor deposition can coat the internal voids and metal bridges within nickel foam with graphene. By compressing the nickel foam deposited with graphene with a compressive force, a graphene-metal composite is created with a flattened graphene matrix for current to travel across. Even before compression, additional layers of graphene can be deposited, but the graphene cannot be deposited directly onto carbon atoms, which would form graphite. Instead a layer of metal, such as copper, nickel, palladium, gold, or any other metal, can be flash coated over graphene or by any other plating mechanism in order for another layer of graphene to be grown on top of the metal followed by compression after a desired number of layers of graphene have been deposited. In some embodiments, the porous metal foam enhanced with graphene or stanene can be used in fiber optics to increase thermal, electrical, and shielding properties.

These and other advantages of the present technology will be described with reference to the collective drawings.

Figure 1B:
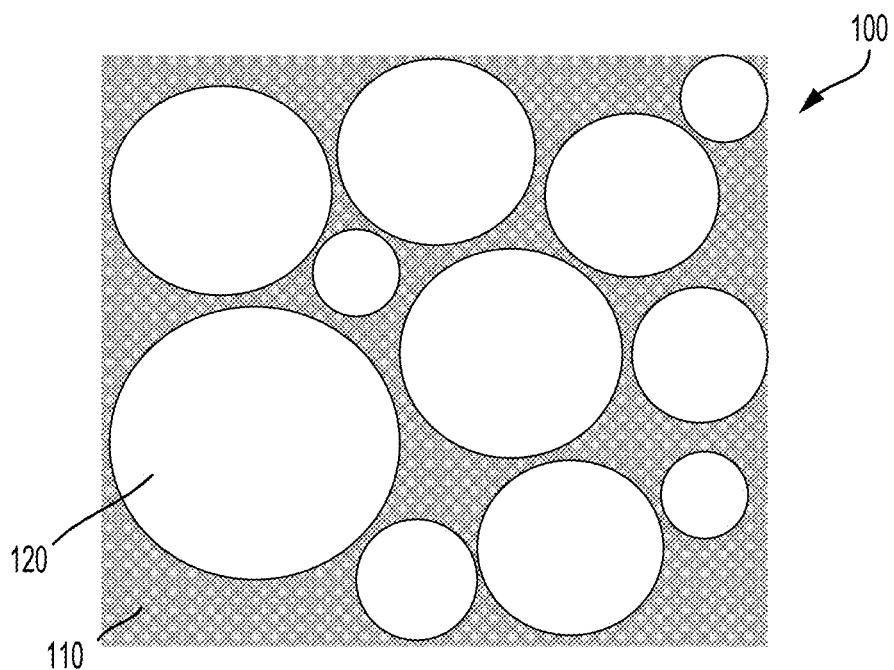
FIG. 1B is a conceptual drawing showing an open-cell metal foam substrate such as nickel foam.

Referring now to FIGS. 1A and 1B, which collectively illustrate an embodiment of nickel foam, FIG. 1A is a SEM micrograph depicting an exemplary microstructure of foamed nickel. FIG. 1B is a conceptual drawing showing an open-cell metal foam substrate. An open-cell metal foam refers to the structure formed by a plurality of cells where inside surfaces of the cells are accessible from neighboring cells in contrast to closed-cell structure where individual cells may be self-contained, for example, in a bubble-like structure. The open-cell metal foam structure 100 of FIG. 1B comprises metal foam 110 formed with void spaces 120. According to exemplary embodiments, open-cell metal foam structure 100 is comprised of nickel. Nickel foam is a low density permeable material with a very high porosity. Nickel foam can be made in a wide porosity range, for example, ranging from 70% to 98% by volume. In some embodiments, the porosity of nickel foam used in the present technology is where at least 95% of the volume consists of void spaces or higher.

In some embodiments, the nickel foam utilized in the present technology can be produced by coating polyurethane foam with nickel metal, for example, by chemical vapor deposition (CVD). The nickel-coated polyurethane foam is heated to remove the polymer substrate, leaving the porous nickel as the finished product. The pore size is determined by the pore size of the polymer template. The CVD process is unique in that it allows a uniform 3-D distribution of nickel on the polymer substrate over a wide range of thicknesses of the nickel. The thickness of the nickel is determined by residence time inside a plating chamber.

Figure 2:
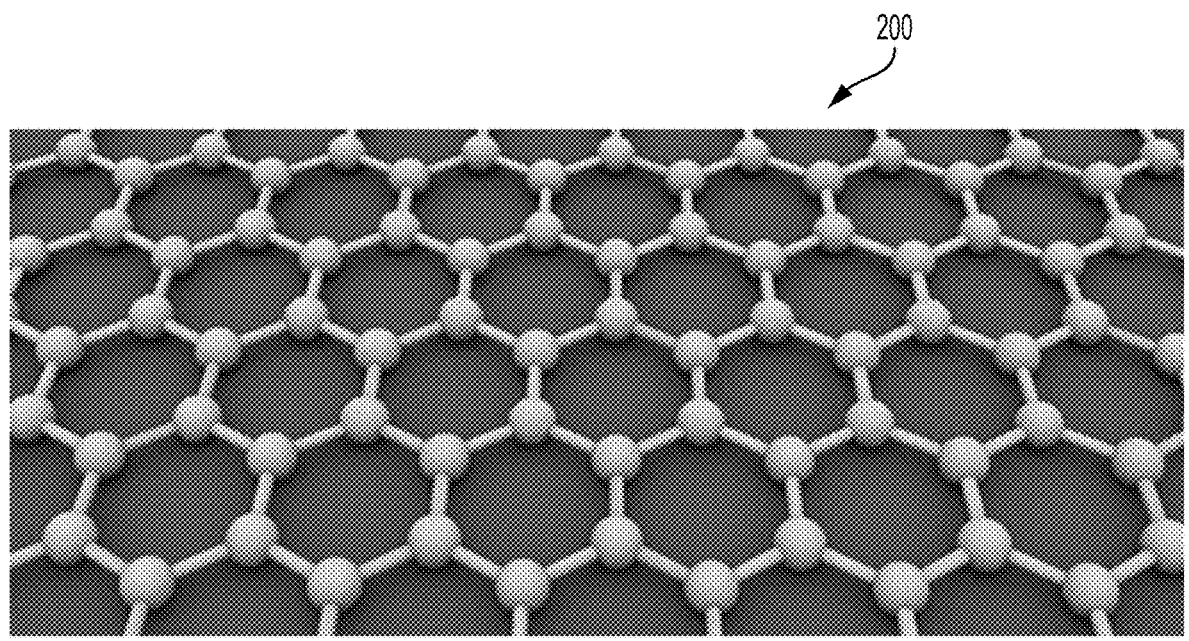
FIG. 2 illustrates the chemical structure of graphene.

FIG. 2 illustrates the chemical structure of graphene. Graphene is a two dimensional sheet of carbon arranged in hexagonal honeycomb lattice that has highly desirable physical properties. Graphene is the strongest material compared to other materials in Table 1, having a Young's modulus of 1000 GPa, yet it is extremely flexible, quite stable, and mechanically resilient. Graphene can also be transferred onto any shaped surface, flat or irregular. Graphene is also the best electrical conductor compared to other materials in Table 1, having a theoretical conductivity of 5020 W/m*K, and graphene transmits heat very efficiently. Graphene, being a single atomic layer thick, has a large surface to volume ratio; however, the thinness of graphene results in very little capacity.

Other carbon allotropes that comprise variations on the lattice structure of graphene are graphite, diamond, and carbon nanotubes. Graphite comprises many layers of graphene stacked on top of each other. While each layer of carbon atoms are tightly bound, only weak bonds known as van der Waals bonds exist between the layers. These weak van der Waals bonds enable the layers to slide laterally, making graphite slippery and brittle. As seen in Table 1, the conductivity of graphene can be almost 3 times higher or more than the conductivity of graphite.

Diamond is the most stable form of pure carbon. There are two ways, in order to achieve its tetrahedral lattice structure, very high pressure and high temperature or chemical vapor deposition, making diamonds difficult to make. Diamond is about 15 times denser than graphene, but graphene has a higher tensile strength with a similar Young's modulus described in Table 1.

Carbon nanotubes are layers of graphene that have been grown into a tube. While carbon nanotubes can have diameters only in nanometers, carbon nanotubes can grow to millimeters in length. Carbon nanotubes are one of the strongest fibers with high conductivity like graphene. Some carbon nanotubes have diameters of 1.3 to 3 nanometers, which are microscopic and much smaller than the smallest voids in nickel foam. Unlike single layers of graphene, carbon nanotubes are able to switch on and off using three times less power than traditional silicon transistors.

TABLE 1

Strength Properties and Thermal Conductivity of Various Materials.

| Material | Conductivity (W/m * k) | Density (g/cm$^3$) | Tensile strength (MPa) | Young Modules (GPa) |
| --- | --- | --- | --- | --- |
| Stainless Steel | 16 | 8.74 | 2000 | 210 |
| Tin | 67 | 7.3 | 15-200 | 47 |
| Nickel | 91 | 8.908 | 140-195 | 170 |
| Aluminum | 210 | 2.71 | 40-50 | 70 |
| Brass (70Cu—30Zn) | 115 | 8.5 | 550 | 97 |
| Copper | 398 | 8.94 | 220 | 130 |
| Gold | 315 | 19.32 | 100 | 79 |
| Silver | 428 | 10.49 | 170 | 83 |
| Diamond | 2500 | 3.51 | 60000 | 1050 |
| Graphite (pyrolytic, some planes) | 300-1500 | 1.3-1.95 | 6.9 to 100 | 8 to 15 |
| Graphene (theoretical) | 5020 | .215 | 130000 | 1000 |
| Carbon Nanotubes (theoretcal) | 3500 | 0.116 | 11000-63000 | N/A |
| Carbon Fiber | 21-180 | N/A | 1600 for laminates, 4137 for fibers alone | N/A |

Figure 3:
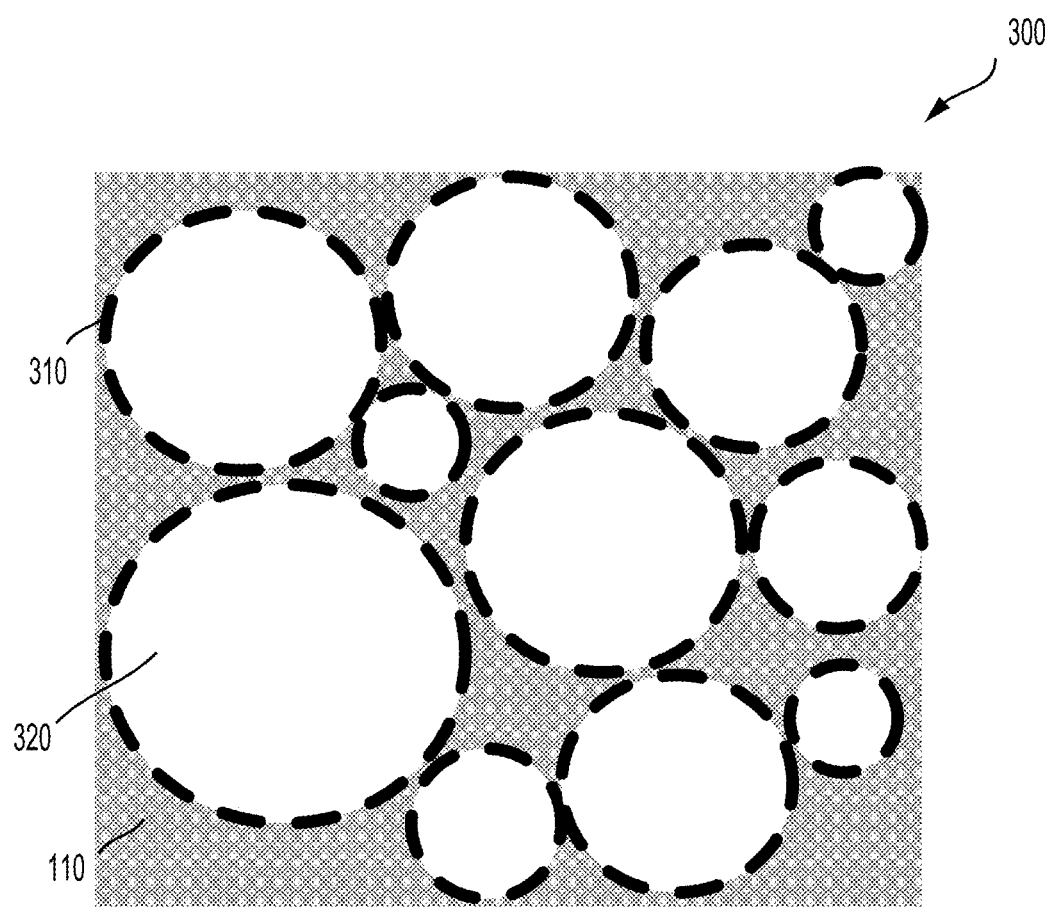
FIG. 3 is a conceptual drawing showing the result of chemical vapor deposition of graphene in an open-cell metal foam substrate to form an example open-cell graphene-metal composite.

FIG. 3 is a conceptual drawing showing chemical vapor deposition of graphene in an open-cell metal foam substrate 110 to form an open-cell graphene-metal foam 300 arranged according to embodiments described herein. Graphene layer 310 may be deposited by a CVD process on metal foam 110 to form a graphene-metal foam 300. For example, graphene layer 310 may be deposited on the inner surfaces of metal foam 110 in metal foam void spaces 120, resulting in graphene-metal foam void spaces 320.

Figure 4:
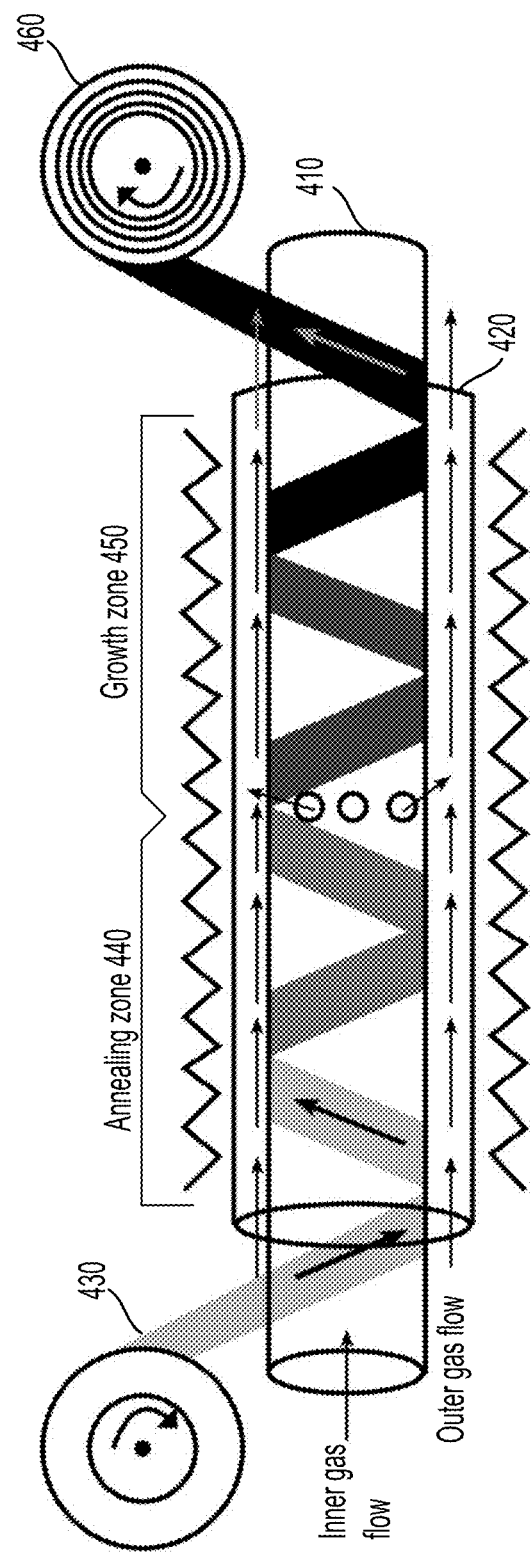
FIG. 4 illustrates an example of a chemical vapor deposition (CVD) manufacturing process.

The CVD process illustrated in FIG. 4 may use any suitable materials and conditions for forming graphene by CVD. For example, in a sealed center chamber comprising an inner tube 410 and an outer tube 420, at least two gases, such as methane ($CH_4$) and hydrogen ($H_2$) can be flowed such that the at least two gasses can meet at a vortex in the center. A roll of a metal foam substrate 430, such as nickel foam, can be sent through the sealed chamber. As the roll of metal foam substrate 430 is heated inside the sealed center chamber at annealing zone 440 and methane gas is flowed through inner tube 410 and hydrogen gas flowed through outer tube 320, the hydrogen catalyzes a reaction between methane and the surface and voids of the roll of metal foam substrate 430, causing carbon atoms from the methane to be deposited onto and within the voids of the metal foam substrate 430. Once a carbon atom occupies a position on the surface of the metal substrate, it pushes other carbons to the side, creating a one atom thick layer of carbon. As the sealed center chamber is quickly cooled at growth stage 450, the deposited carbon layer is crystalized into a continuous graphene layer on metal foam substrate 430, and the deposited carbon layer is kept from aggregating into bulk graphite.

In some embodiments, a payout and take up mechanism moves the roll of metal foam substrate 430 through the sealed center changer, resulting in a roll of metal foam substrate deposited with graphene 460.

CVD of graphene on a metal foam substrate provides a much larger surface area to be coated with graphene compared to a single layer of graphene that is deposited on a solid metal film. For example, a 1 inch by 1 inch by 0.003 inch piece of solid nickel film coated by graphene could have two layers of graphene per side, which would be 0.0000000078 inches thick and $46 \times 10^{15}$ atoms per side based on the two layers. Based on the amount of atoms, the graphene weight in grams can be calculated. Similarly, the weight of atoms deposited onto a 1 inch by 1 inch by 0.062 inch thick piece of nickel foam before compression can be calculated based on the porosity of the metal foam.

Figure 5:
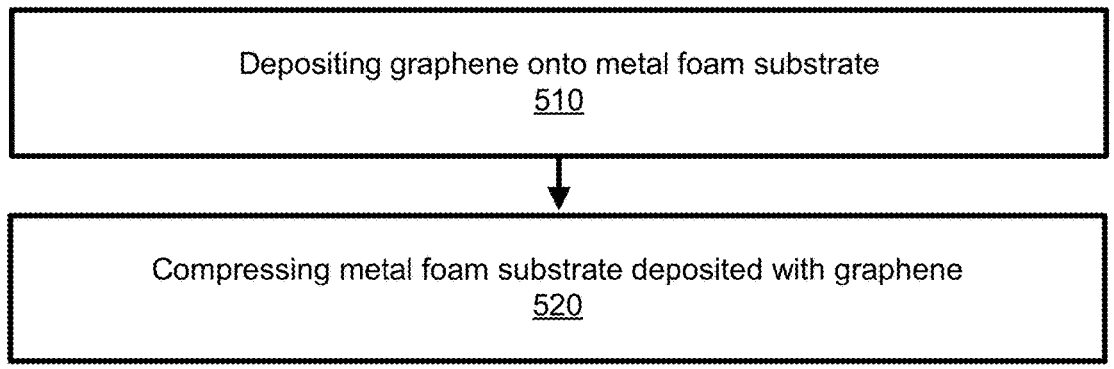
FIG. 5 is a flow diagram illustrating an example method of manufacturing a graphene-metal composite according to exemplary embodiments of the present technology.

FIG. 5 is a flow diagram illustrating an example method of manufacturing a graphene-metal composite according to exemplary embodiments of the present technology. FIG. 5 illustrates a method 500 for manufacturing a graphene-metal composite. At step 510, method 500 begins by depositing graphene onto a porous metal foam substrate. In some embodiments, the porous metal foam substrate is nickel foam where the nickel foam has a high porosity of at least 95% or more. In various embodiments, graphene can be deposited onto the nickel foam by the chemical vaporization deposition process described in FIG. 4.

Various different methods can also be used to produce graphene. According to some embodiment, graphene can be chemically synthesized by using chemicals to purify graphite and heat to reshape and reform the carbon atoms into nano-structured configuration which can be processed into sheets, added onto nickel foam, or processed into carbon nanotubes. Carbon nanotube ropes can be grown throughout the porous structure of a metal foam using a catalyst material and a heated carbon-rich gas flowing over the metal surface. These carbon nanotube ropes would occupy the voids within the metal foam, and when the desired amount of carbon nanotubes is produced, the foam can be compressed, leaving a thermal and electrical super highway through the materials.

In some embodiments, graphene can be produced from graphite using ultrasonic irradiation. Graphite is added in a mixture of dilute organic acid, alcohol, and water, and the mixture is exposed to ultrasonic irradiation. The acid separates the graphene sheets head together by van der Waals bonds, resulting in a large quantity of undamaged, high-quality graphene dispersed into water.

Figure 6:
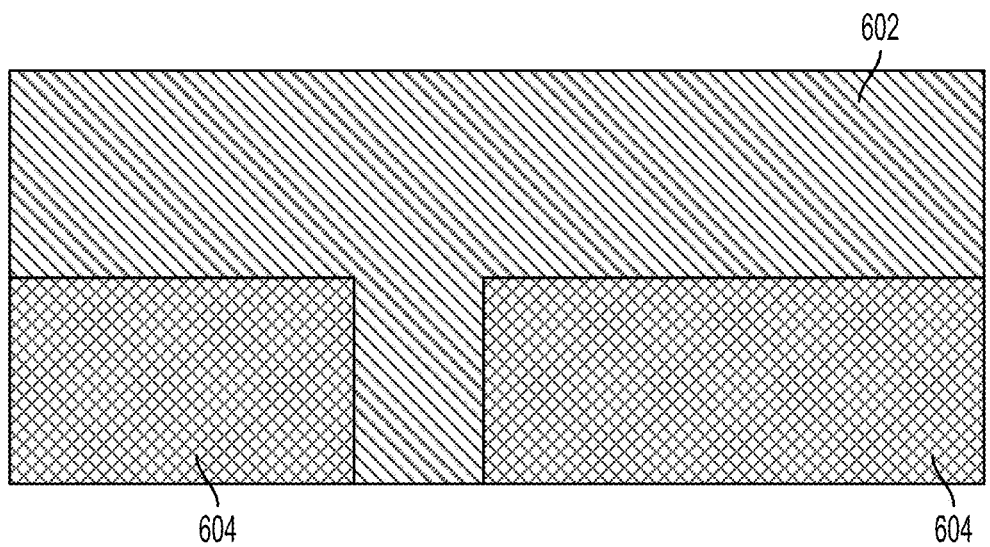
FIG. 6 is a cross sectional view of an embodiment of clad material with enhanced graphene according to exemplary embodiments of the present technology.

In an exemplary embodiment depicted in FIG. 6, graphene-enhanced nickel foam 602 can be roll bonded to the surface of a structural material 604, filling pre-stamped openings to allow for a thermal and electrical conduit to pass through the structural material. This will allow thermal, electrical, and shielding properties to travel in a co-planar direction as well as a trans-planar path, thus adding more capacity to the mass and amplifying the composite's ability to act as a super conduit. By having relief areas in the structural member before roll bonding the structural member to the graphene-enhanced foam, thermal pathways can be created to help dissipate heat through the structural member and out of a device through the metal foam composite. See, e.g., U.S. patent application Ser. No. 14/876,733, filed Oct. 6, 2015, titled "Multiple Layered Alloy/Non Alloy Clad Materials and Methods of Manufacture", the disclosure of which is incorporate herein by reference in its entirety for all purposes. The present application discloses additional embodiments of roll bonded clad material.

Figure 7:
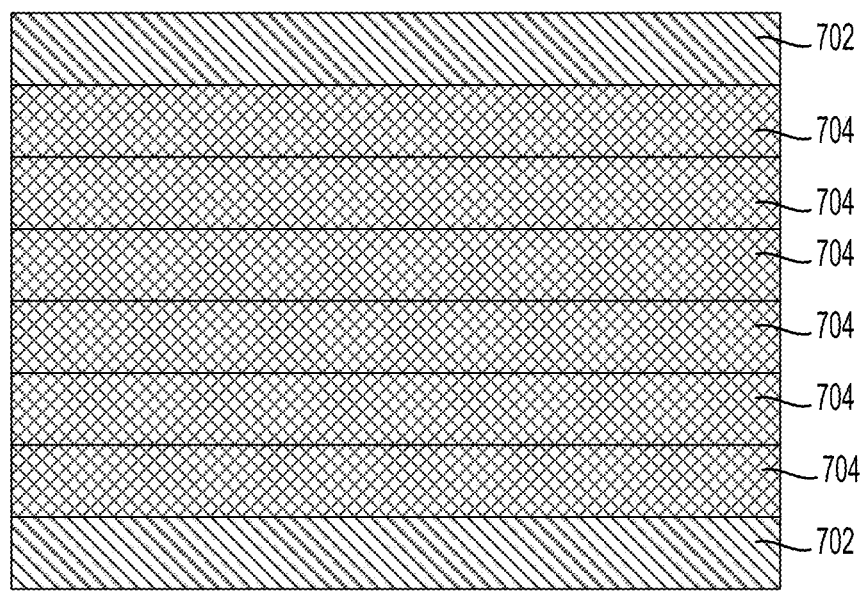
FIG. 7 is a cross sectional view of an embodiment of roll bonded nickel and copper foil enhanced with graphene according to exemplary embodiments of the present technology.

According to some embodiments as depicted in FIG. 7, layers of copper foil 702 coated with graphene can be roll bonded. For example, a 0.003 inch thick roll bonded material may comprise two outers layers of nickel 702 each 0.0004 inch think and six 0.0004 inch layers of copper 704 between the layers of nickel 702. Coating the outside of two layers of nickel foil 702 yields eight layers of graphene and 12 more layers of graphene are added to the six copper layers 704, giving a total of 20 layers of graphene within the 0.03 inch of roll bonded material. In some embodiments, graphene can be grown on thin sheets of nickel, copper, tin, or any other metal. After the growth process, the thin metal sheets are atomically bonded together by a cladding process. The resultant composite has many layers of metal and graphene, adding more capacity to the mass, allowing for greater thermal, electrical, and shielding properties of the composite.

In another embodiment, metals, thermal plastics, or conductive elastomers can be 3D printed into the voids of nickel foam. Injection molding, compression molding, and die casting are additional methods of introducing thermal plastics or metals on the surface or into the voids of nickel foam. According to exemplary embodiments, thermal paths can be selectively added to certain areas of the nickel foam, making the selected area conductive, while other particular areas would be selected to be insulated within the nickel foam. After the selective addition of thermal paths, the nickel foam can be compressed.

Figure 8:
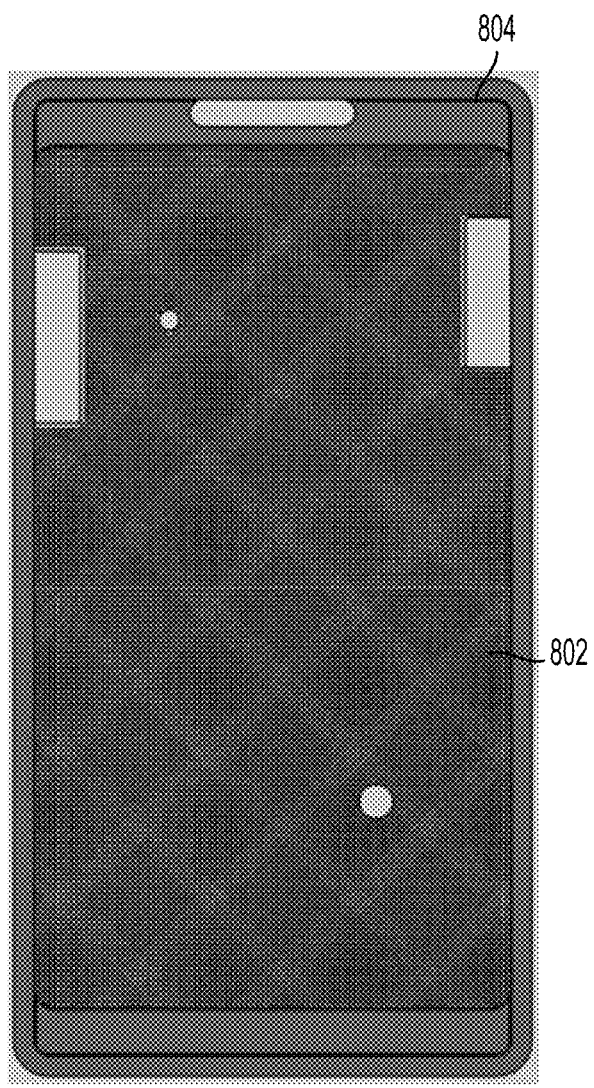
FIG. 8 illustrates die casting enhanced nickel foam into a frame according to exemplary embodiments of the present technology.

In some embodiments, enhanced graphene-nickel foam 802 that may have at least one layer of graphene deposited onto a metal foam substrate can be die casted or injection molded into a frame 804, such as an aluminum mobile phone frame, any aluminum frame, zinc frame, plastic frame, or frame of any material, as depicted in FIG. 8. After die casting nickel foam 802 into an aluminum casing 804, there would be very little stress between the nickel foam 802 and aluminum casing. The nickel foam 802 could then be compressed to a thickness of 0.1 mm to 0.45 mm while keeping the surface of the foam uniform and flat and parallel to the die cast frame 804.

At step 520, the metal foam substrate deposited with graphene is compressed to a desired level of thickness using any desired means of compression. In some embodiments, the metal foam substrate deposited with graphene is compressed substantially closing the voids within the metal foam substrate and making the metal foam substrate with graphene thinner than the thickness of the non-compressed metal foam substrate. For example, nickel foam with thickness of 0.200 inches can be coated with graphene by CVD. Then, the coated nickel foam is rolled or compressed to form a graphene-nickel composite with a thickness of 0.010 inches, twenty times thinner than the thickness of the non-compressed nickel foam. In various embodiments, the amount of compression can be used to control the elastomeric properties of the graphene-metal composite.

The graphene-nickel composite comprises a matrix of graphene inside the nickel foam such that the composite is 40 times more efficient than a single layer of graphene. The properties of the nickel foam are tremendously enhanced by the compression, creating a thermal and electrical conduit. Since graphene is elastic and stretchy, it can be compressed. However, graphene should not be subjected to high heat (over 700° C. in the presence of oxygen) or else it will decompose and convert to carbon dioxide. Also, graphene has been reported to be as brittle as ceramics and can crack. Graphene can even crack while it is manufactured.

Figure 9:
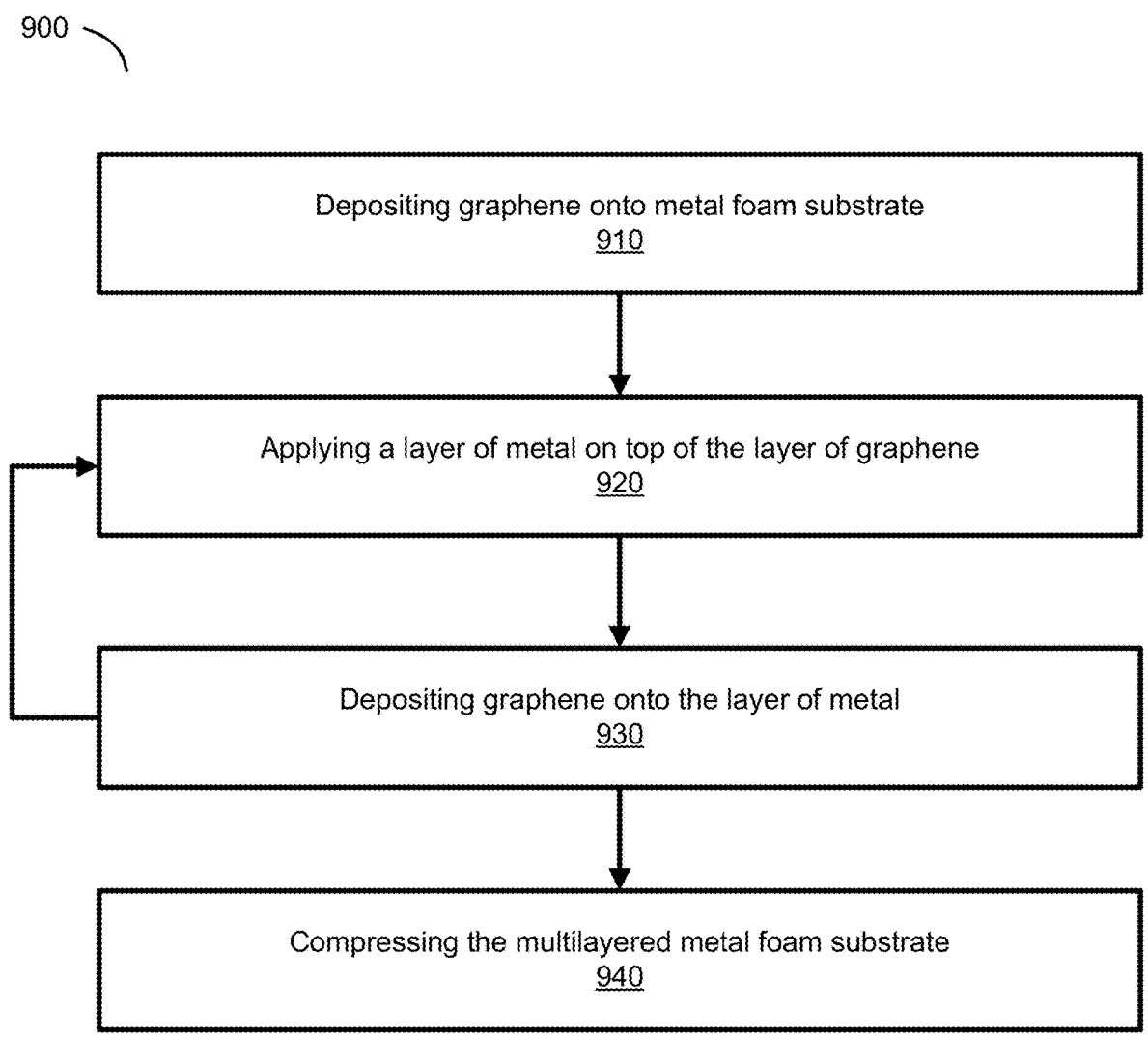
FIG. 9 is a flow diagram illustrating another example method of manufacturing a graphene-metal composite according to exemplary embodiments of the present technology.

FIG. 9 is a flow diagram illustrating another example method of manufacturing a graphene-metal composite according to exemplary embodiments of the present technology. FIG. 9 illustrates a method 900 for manufacturing a graphene-metal composite where the metal foam substrate can be coated with a plurality of layers of graphene. Similar to method 500, method 900 begins at step 910 by depositing graphene onto a porous metal substrate. In some embodiments, the graphene is deposited by chemical vapor deposition, the graphene is chemically synthesized, or any other method of synthesizing and depositing graphene.

At step 920, a layer of metal is applied to the metal foam substrate deposited with graphene. In some embodiments, the metal is flash coated or plated over the graphene. In order for graphene to be layered on the metal foam substrate, a metal layer needs to be applied between graphene layers because as previously discussed direct layers of graphene will create graphite, which is brittle and has less desirable thermal properties than graphene. By adding multiple layers graphene and metal to a metal foam substrate, the thermal and electrical properties of the graphene-metal composite could be increased exponentially. Additionally, in various embodiments, the metal that is applied between the layer of graphene can be any metal, including, but not limited to copper, nickel, palladium or gold. Furthermore, any substrate upon which graphene can be grown can be used in the present technology, such as glass and ceramic, although their conductivity is low. Nickel has better properties for growing graphene allowing two layers of graphene per side to be grown in a single process. It is also very malleable, has good corrosion quality, but it is not very strong and its conductivity is about four times lower than copper. Copper is soft, malleable, and has great thermal characteristics.

At step 930, graphene is deposited onto the layer of metal using chemical vapor deposition, the graphene is chemically synthesized, or any other method of synthesizing and depositing graphene. Then steps 920 and 930 can be repeated to deposit a desired number of layers of graphene. For example, steps 920 and 930 can be repeated 6, 7, or 8 times. Once the desired number of layers of graphene is deposited, the multilayered metal foam substrate is then compressed or rolled at step 940 to a desired level of thickness, resulting in a graphene-metal composite.

According to some embodiments, the present disclosure involves the fabrication of metal foams (such as nano-porous foams) within molds. In some embodiments, the metal foams are formed within the mold and removed for use. In other embodiments, the metal foams are formed within the mold to create device such as a battery or heat exchanger. In these embodiments the metal foam is an integral part of the resultant device.

The present disclosure contemplates various methods for creating molded metal foams as well as devices that incorporated metal foams. In general, some methods include creating metal foams through loss carbonate sintering. Other embodiments include creating metal foams through chemical or physical vapor deposition. Some embodiments include creating nano-porous graphene foams built on metal foam scaffolding. Metal foams disclosed herein can be augmented through magnetizing, applying highly order pyrolytic graphite, carbon nanotube, and/or diamond-liked carbon coatings. Some embodiments include augmenting a metal foam with a two dimensional coating (including but not limited to transition-metal dichalcogenides), and in some specific embodiments to creating graphene nanofoams.

In general, the metal foam 1002 is molded inside using a pipe as the mold 1004. The metal foam is formed inside the pipe and this example is featuring a heating element that can be made using the following materials as the metal foam core.

element that can be made using the following materials as the metal foam core.

Figure 10:
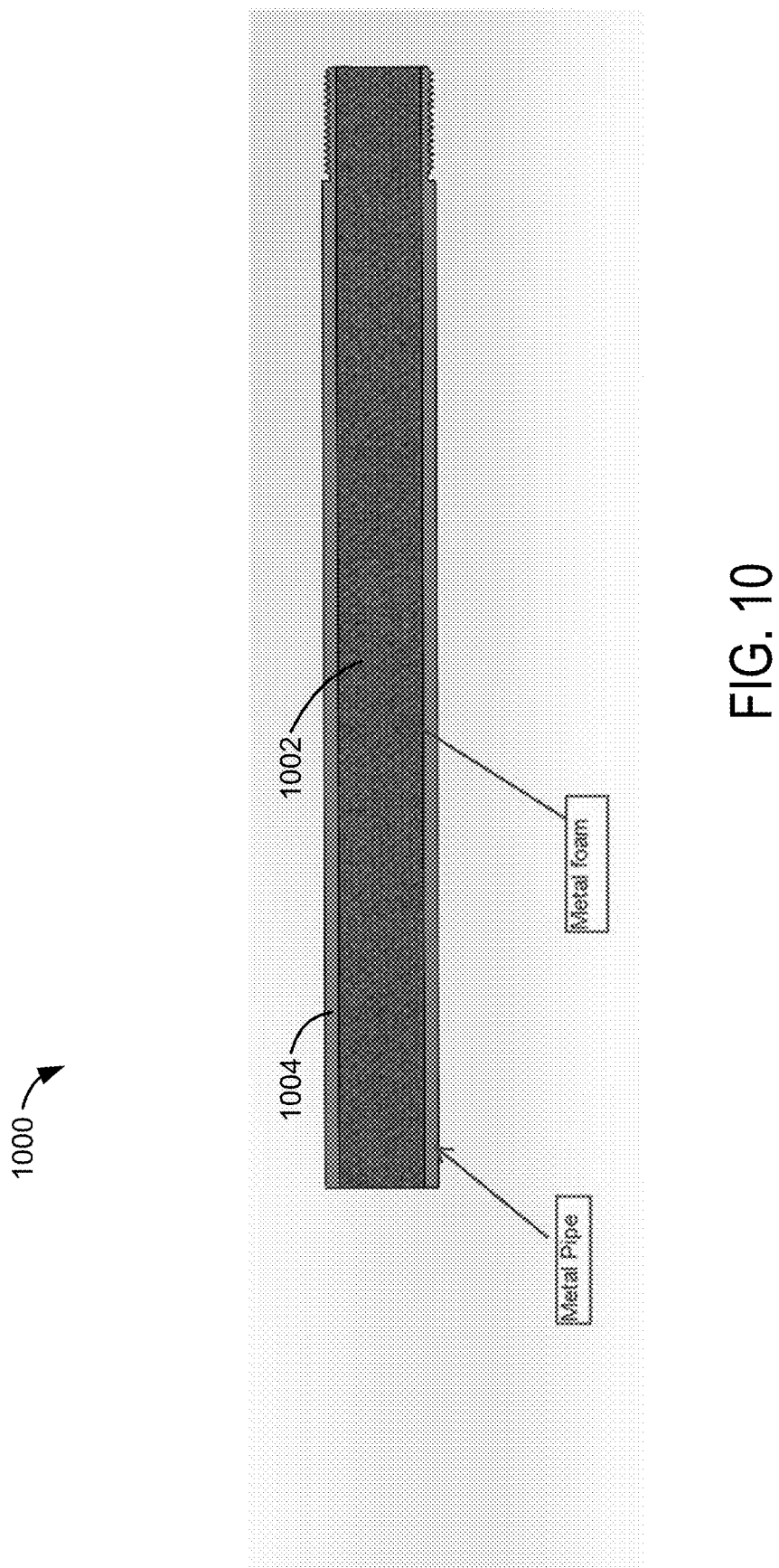
FIG. 10 is a cross section view of an example thermal exchange device comprising a mold/casing with an integrated metal foam core, constructed in accordance with the present disclosure.

In more detail, FIG. 10 is an example device 1000 that comprises a metal foam 1002 of the present disclosure. In general, the device 1000 is in the form of a heating element that can be used to heat a fluid flowing through the metal foam 1002. For example, the device 1000 can be used to heat water flowing through the metal foam 1002 by heat transfer from a mold 1004 which is also the mold used to create the metal foam 1002.

In some embodiments, the metal foam 1002 can be created from any metal or alloy. For example, the metal foam 1002 can be molded from copper, nickel, tungsten, iron, platinum, cobalt, and any combinations thereof. Non-limiting examples of suitable alloys include nickel chrome, cupronickel, tungsten, and kanthal—just to name a few.

The metal foam 1002 can be shaped in advance through any method and then inserted into the pipe, or it can be molded integrally inside the mold 1004. After molding the metal foam 1002 into the pipe, different coatings can be added to support different properties.

In some embodiments, after molding of the metal foam 1002, the metal foam 1002 can be coated with one or more layers of additional material to engender various properties such as strength, modulus, magnetism, insulation, thermal conductivity, electrical conductivity, and so forth.

The following list provides example suitable materials can be used to coat the metal foams depending on the desired resultant properties of the metal foam or integrated device. Copper can be used as it is electrically and thermally conductive, whereas nickel is preferentially electrically conductive. Chrome is also electrically conductive. Graphene is both electrically and thermally conductive, while graphane is an electrically an insulator but thermally conductive. Stanene is also very conductive for electricity but a weak thermal conductor, hexagonal-Boron nitride is electrical insulator and highly thermal conductive TMDs are having electrical bandgap and act like semiconductor.

It will be understood that certain material compatibility issues may be addressed when layering various metals. By way of non-limiting example, adding such materials as graphene to a tungsten requires a layer of copper/nickel/iron/cobalt as an initial layer on the metal foam.

In some embodiments, various layers may be placed on a metal foam to achieve various physical effects at the different layers. Also, a single layer may have different sections with different layers built upon it. For example, a metal foam can be layered with graphene and sections of the graphene layer may be masked leaving other sections exposed so that CVD or PVD deposition of metals can be created. The deposition can occur through any means that would be known to one of ordinary skill in the art with the present disclosure before them. In one non-limiting example, Sulphur gas and molybdenum oxide used as precursor for MoS2 formation, Selenium and molybdenum for MoSe2 formation, Selenium and Tungsten Oxide for WSe2 formation and so forth, while boron trioxide and ammonia are used for an h-BN coating.

Figure 11:
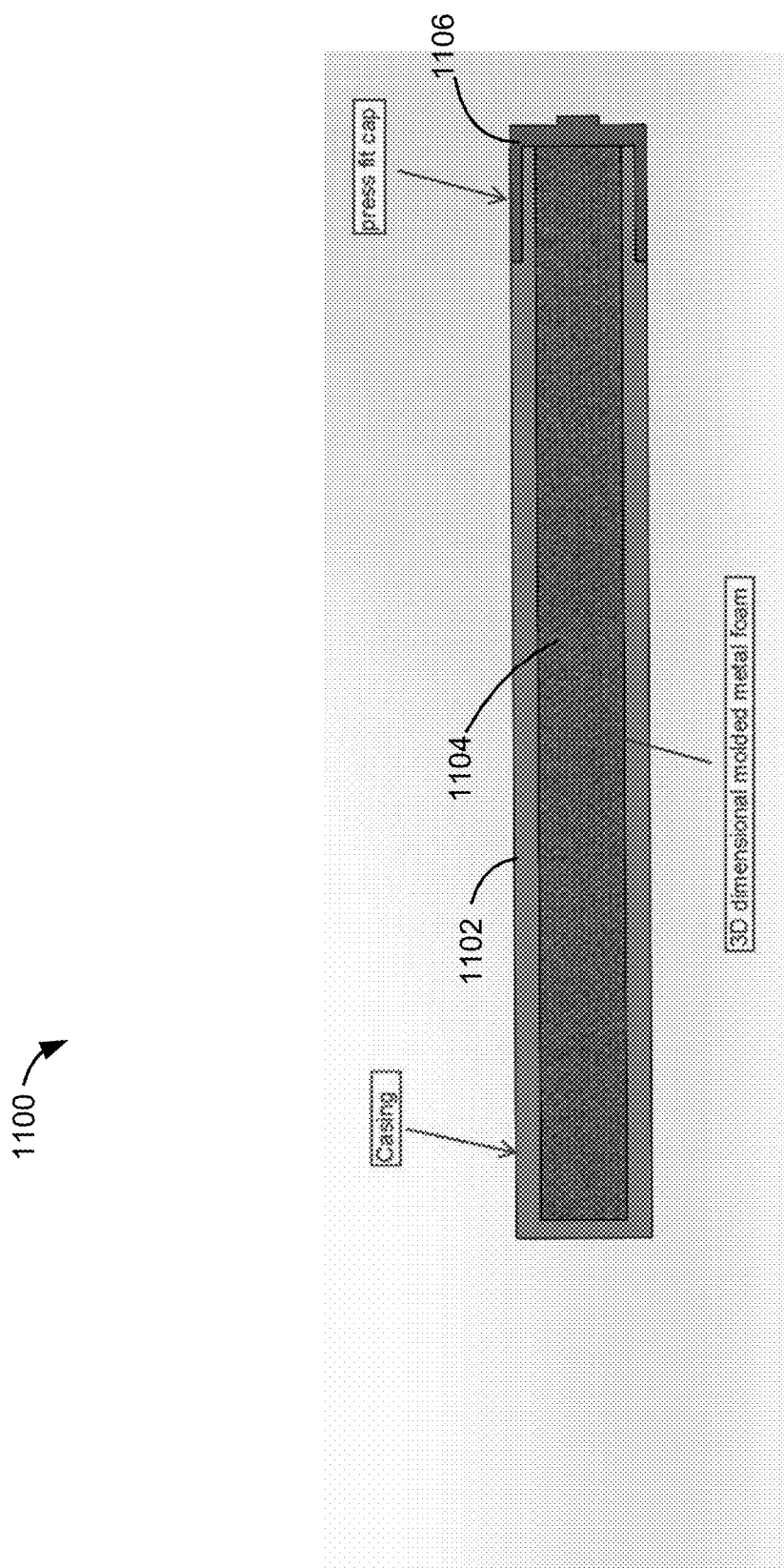
FIG. 11 is a cross section view of an example energy storage device (e.g., battery) comprising a mold/casing with an integrated metal foam core and capped end, constructed in accordance with the present disclosure.

FIG. 11 illustrates another example device 1100 of the present disclosure in the form of a battery.

The device 1100 comprises a relatively thick wall casing with press fit cap(s) which have a three-dimensional metal foam molded inside the casing. The metal foam includes a copper metal foam molded inside of the casing and coated with graphene to be used as a battery. The casing can be ceramic, metal, plastic, or any other suitable material.

In more detail, the device 1100 comprises a casing 1102 that encloses a metal foam 1104. A cap 1106 can be press fit on an open terminal end of the casing 1102. In general, the metal foam 1104 can be formed within the casing 1102 (or inserted therein after prior manufacture). Due to the porosity of the metal foam 1104 an electrolyte can be introduced into the casing and in contact with the metal foam 1104. The high surface area of the metal foam 1104 provides for superior charging capabilities over lead slab or other battery types that do not incorporate metal foams.

As noted above, metal foams of the present disclosure can be created using loss carbon sintering methods. In general, these methods begin with creating a mold which will receive the metal foam. The mold can be created from any material that is amenable to the pressures and temperatures required to produce the metal foam.

The mold can be a substantially continuous cross section mold such as those illustrated in FIGS. 10 and 11, or can include a mold with features so that the metal foam is produced with any desired geometrical shape, including irregular shapes.

The metal foam is created by mixing a pure metal powder with various size particles with potassium carbonate, also having varied particle sizes. The ratio of metal powder and potassium carbonate can be in any ratio desired, which will in part determine the density of the metal foam. In some embodiments, the metal powder can be replaced with any alloy powder such as nichrome, cupronickel, kanthal, stainless steel, bronze, brass, and so forth.

The mixture is compressed inside the mold with pressure of approximately 150 Mpa or higher to make the mixture compact. The compressed mixture is then annealed at temperature of approximately 700° C. or above to decompose the potassium carbonate into carbon dioxide and potassium oxide. At the same time the metal powder will fuse together to form the metal foam.

In some embodiments, the potassium carbonate can be replaced with magnesium oxide or sodium carbonate or other carbonate or nitrate salts.

In various embodiments, the metal will be annealed a second time at higher temperature of approximately 900° C. for potassium carbonate to melt away the residue potassium oxide (or other salts oxide), leaving only metal foam behind.

In additional embodiments, the metal foam can be soaked into water or acidic solution or other solvent to dissolve away the potassium oxide (or other salts oxide), leaving only metal foam behind.

FIG. 12 is a flowchart of an example method 1200 of the present disclosure for creating a metal foam using a loss carbon sintering method. The method includes a step 1202 of mixing an amount of a metallic powder with an amount of sacrificial particles in a specified ratio to create a mixture. Next, the method includes a step 1204 of applying pressure to the mixture that is sufficient to compact the mixture, decompose the sacrificial particles, and fuse the metallic powder into the porous metal foam.

To be sure, in this method, the sacrificial particles can include potassium carbonate or any of the other particulate matters that were disclosed as being substitutable for potassium carbonate. As noted above, the metallic powder comprises any of copper, nickel, tungsten, iron, platinum, cobalt, or any combinations thereof. Alternatively, the metallic powder can comprise any of potassium carbonate, magnesium oxide, sodium carbonate, a carbonate, a nitrate salt, any salts oxide, or any combinations thereof.

In some embodiments, the method can include a step 1206 of annealing the porous metal foam at an annealing temperature. To be sure, the annealing temperature is a temperature that is higher than the temperature used initially to fuse the metal foam. As noted above, the metal foam can be removed from the mold in some embodiments, while in other embodiments the metal foam remains inside the mold and the resultant device can be utilized for any suitable use.

Another example method for creating a metal foam includes the use of chemical vapor deposition (CVD) and/or physical vapor deposition (PVD) processes over a polymer or salt particulate matrix or scaffolding.

In these instances the mold can be constructed with an open face or a closed face mold having a small opening which receives the components used to create the metal foam. The mold can be made of a solid or porous metal or it can be a membrane with different levels of porosity. The mold could also be a combination of metal and membrane material. Non-limiting examples of membrane materials include porous steel, or porous ceramic such as zeolite, alumina, and so forth.

In some embodiments, the mold can be coated with a thin layer of polymer film or grease to prevent the coalescent of metal during metal deposition, which may deleteriously affect the porosity of the metal foam in areas where coalescence may occur.

To create the metal foam a sacrificial material such as particulate polyurethane balls, polyurethane foam, or film can then be placed inside the mold. In some embodiments the polyurethane balls can be directly three dimensionally printed onto the mold with any shape and geometry. Other types of additive manufacturing methods known to one of ordinary skill in the art can also be utilized, which can provide for a uniform polymer matrix in some embodiments. When using polyurethane balls make it will be understood that adjacent polyurethane balls should be touching each other and that they follow a design of a mold pattern. Also, polyurethane can be replaced with other polymers such as polyethylene, polypropylene, nylon, polyvinyl acetate, ethylene vinyl acetate, and the like, or combinations of any of the polymers for ball construction.

Alternatively, the polyurethane balls can be replaced with various kinds of salts or ionic compounds that are soluble in water and stable in very high temperatures such as a chloride salt (e.g., NaCl, KCl, MgCl, CaCL, etc.), a bromide salt (e.g., NaBr, KBr, MgBr, CaBr, etc), and Iodide salts (e.g., NaI, KI, etc.).

In some embodiments, the sacrificial particulate can be fused together using any of heat, pressure, or by using a chemical solvent (or any combinations and permutations thereof) to form a polymer matrix. Some embodiments do not require fusing.

In some embodiments the porosity of the metal foam is selectable based on size and shape of the polymers (e.g., sacrificial particulates) and by the amount of pressure that is applied to them. The porosity of the metal foam can also be determined by using a chemical solvent to remove the polymers and the amount and type of solvent will also play a role is this process as well.

As noted above, once the polymeric matrix is created, the matrix can be coated with a metal or alloy using CVD or PVD to create the conductive metal foam. On the other hand, if salts are used, CVD or PVD can be used to fill the voids to create the conductive metal foam, or directly pouring molten metal onto it to fill the voids in other embodiments.

Example metal foams cane formed can be created from Ni, Cu, Au, Ag, Al, W, and so forth and/or any combinations of any compound with metallic bond, or any metal alloys. In some embodiments, the metal deposition on the polyurethane balls or salts can be enhanced by adding vacuum or pressure to the inside of the mold cavity.

Example CVD processes that can be used in accordance with the present disclosure include but are not limited to thermal CVD, plasma-enhanced CVD (PECVD), vacuum CVD, atomic layer CVD (ALCVD) and other similar processes. Example PVD processes that can be used in accordance with the present disclosure include but are not limited to thermal evaporation, E-beam evaporative deposition, pulsed laser evaporation, cathodic arc deposition, direct current sputtering, magnetron sputtering, ion-induced deposition and other similar processes.

In some embodiments, the metal foam can be directly three-dimensionally printed onto the mold with any shape and geometry.

In embodiments where voids are filled and the desired metal foam thickness is achieved the CVD and PVD methods can include vaporizing the polyurethane balls or diluting the balls with a chemical solvent. If salts are used, the salts can be dissolved with water to reveal the metal foam.

Figure 15:
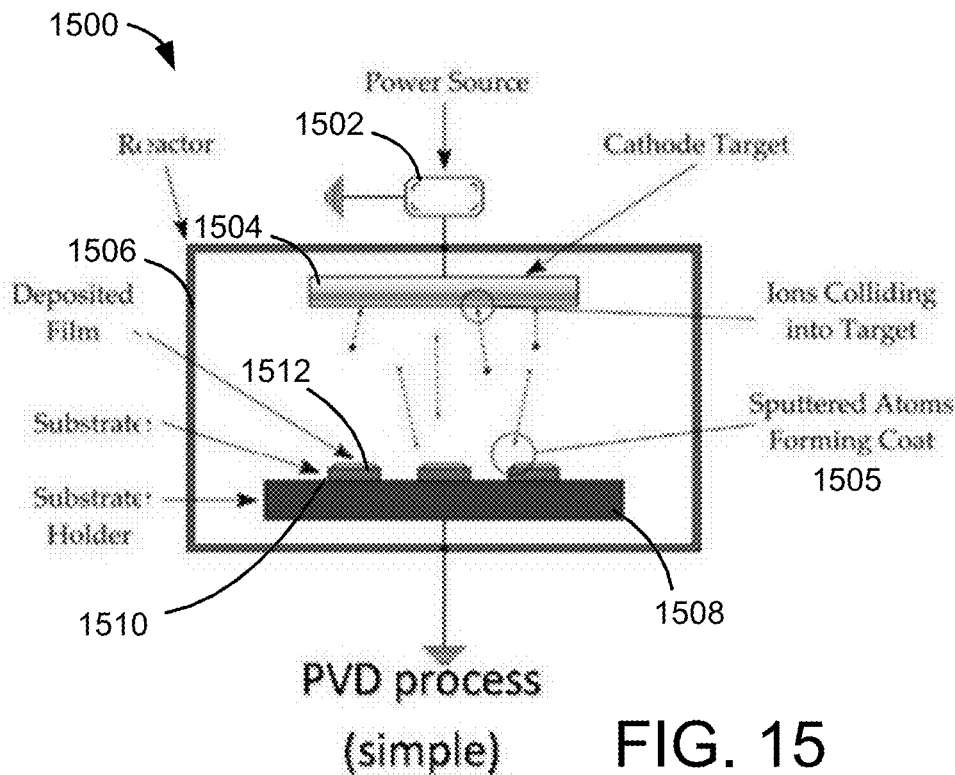
FIG. 15 is a example system and diagrammatic representation of PVD deposition of metal layers on a substrate.
Figure 16:
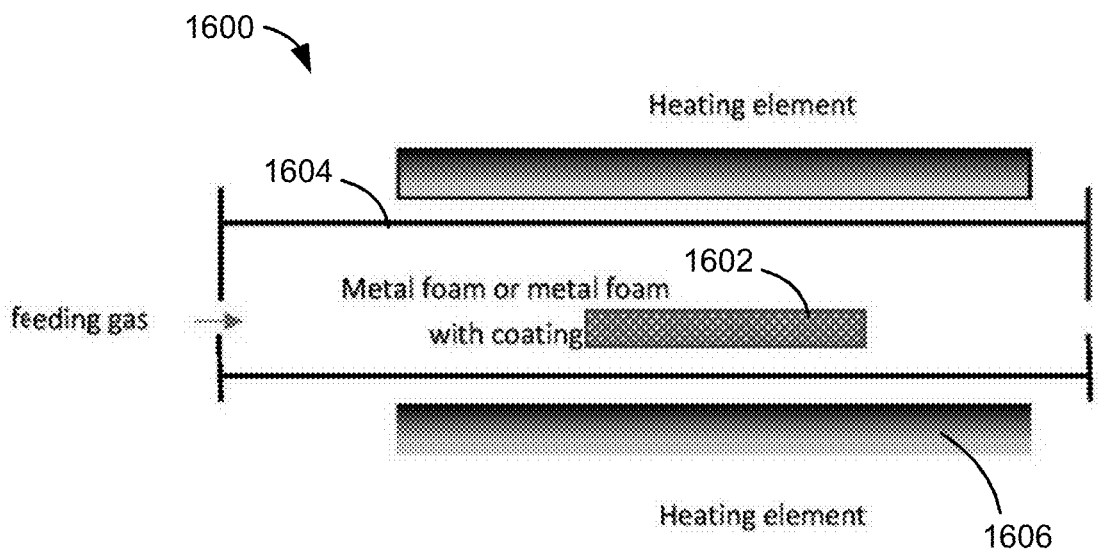
FIG. 16 is a device that incorporates a metal foam of the present disclosure to provide heat exchange of a gas.

Turning briefly to FIGS. 15 and 16, in FIG. 15 an example system for PVD of materials is illustrated. The system 1500 comprises a power source 1502, a cathode target 1504, a reactor vessel 1506, a substrate holder 1508, and a substrate 1510. In operation, the cathode target 1504 is used to ionize a gas and powdered metal within the reactor vessel 1506 as they contact the cathode target 1504. The ionized powdered metal or alloy deposits on a substrate. Thus, a substrate 1510 placed on the substrate holder 1508 is subjected to sputtered metal atoms 1505 to create deposited metal layers, such as deposit 1512. Areas where deposit layers are not present are due to masking or physical attributes of the substrate. For example, portions of the substrate outer surface may not be conductive or magnetic, causing the sputtered metal atoms not to stick to the substrate 1510. A resulting device 1600 is illustrated in FIG. 16. The device 1600 comprises a metal foam 1602 created from the PVD process/system illustrated in FIG. 15. Heating elements such as heating element 1606 can be placed above and/or below a housing or mold 1604. In this embodiment a feed gas is pumped into the housing 1604 to contact the metal foam 1602 and receive heat transferred through contact with the metal foam 1602. The metal foam 1602 is in turn heated by the heating elements.

Figure 13:
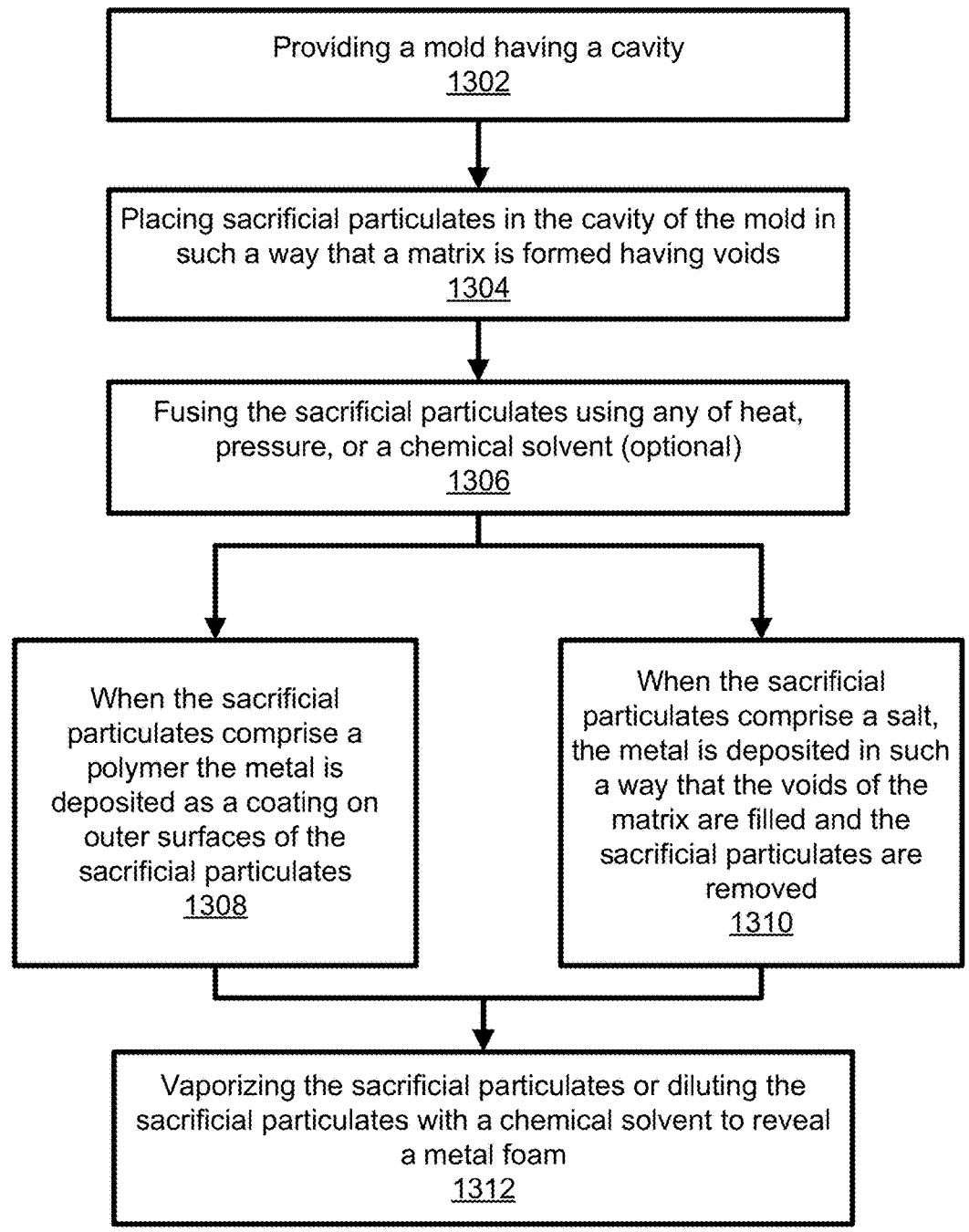
FIG. 13 is a flowchart of an example method for producing a metal foam using CVD of PVD.

FIG. 13 illustrates an example method 1300 of metal foam creation using either CVD or PVD as disclosed. The method includes a step 1302 of providing a mold having a cavity. As noted above, this can include an open or closed mold and the mold can be prepared prior to metal foam manufacture using a polymer film or grease. Next, the method includes a step 1304 of placing sacrificial particulates in the cavity of the mold in such a way that a matrix is formed having voids. This can include building polymeric balls into the mold using additive manufacturing methods or by placing the polymeric balls into the mold.

The method can include an optional step 1306 of fusing the sacrificial particulates using any of heat, pressure, or a chemical solvent. This can create a more stable and fixed matrix.

Generally the method includes depositing a metal onto the sacrificial particulates using any of chemical vapor deposition and physical vapor deposition to create a metal foam. In one specific step 1308, when the sacrificial particulates comprise a polymer the metal is deposited as a coating on outer surfaces of the sacrificial particulates. In an alternative step 1310, the when the sacrificial particulates comprise a salt, the metal is deposited in such a way that the voids of the matrix are filled and the sacrificial particulates are removed.

In some embodiments, the method includes a step 1312 of vaporizing the sacrificial particulates or diluting the sacrificial particulates with a chemical solvent to reveal a metal foam.

Some embodiments allow for plating processes to form a metal foam. For example, a polymer ball matrix can be utilized for plating process to form metal foam. In one embodiment, the polymer matrix that is being shaped is discharged from the mold. The polymer matrix can be plated with Cu and Ni with electroless plating to create a metal foam. After the electroless plating, the plating process can be accelerated with electrolytic with later metal. In some embodiments, an outer surface of the polymer matrix can be coated with a layer of graphite powder or graphite coating through PVD or conductive coating to make the surface of polymer ball matrix electrical conductive for facilitating a later electrical metal plating process. The metal to be coated on polymer matrix can be Ni, Cu, Au, Ag, Cr and so forth.

After the plating, the polymer matrix can be removed through vaporizing or diluting to obtain the metal foam. In various embodiments, the metal that is deposited onto the polymer ball matrix creates a layer of graphene, graphane, or stanene.

Once a metal foam has been created using any of the sintering, CVD, or PVD methods disclosed above, various enhancements may be available for each of these metal foams. In one example method, a metal foam creating using any of the methods disclosed herein can be magnetized.

For example, after a metal foam is created, the metal foam can be transformed to become magnetic. For example, a nickel foam, or alloy foam that contains either nickel, iron, or cobalt can be magnetized either using electric current or rubbing.

In some embodiments, a smart polymer is utilized to create the matrix which includes any high-performance polymer that is capable of changing according environmental conditions. Such materials can be sensitive to a number of factors, such as temperature, humidity, pH, the wavelength or intensity of light or an electrical or magnetic field, can be used to fill the remaining void of the metal foam. In one non-limiting example, a magnetic polymeric matrix can be formed by implantation of magnetic nanoparticles, such as iron, iron oxide (magnetite Fe3O4 and maghemite γ-Fe2O3), nickel, cobalt, cobalt oxide and so forth into a polymer matrix. In another example, magnetic aligned metal nanowire can be implanted into the polymer matrix and fill the void of the metal foam. Example metal nanowire, such as Ni, Fe, Co y FeNi CoFe, CoNi. FePt nanowire and so forth can be aligned with the assistance of an electric field applied to the metal foam.

According to other embodiments, after a metal foam coated with graphene through CVD process is created addition carbon materials can be added to metal-foam/graphene composition to enhanced the properties of graphene. For example, as noted above, a metal foam can be plated with a 2D coating such as graphene through application of graphite powder.

The CVD process of graphene formation can be further extended with a longer CVD period performed at a higher operating temperature and higher concentration of methane or other carbon rich gases such as ethylene, propylene and so forth. This process creates a highly order pyrolytic graphite (HOPG), which will increase the capacity of heat transfer of composite. The HOPG can be further heat treated to form interlayer cross-linking graphite or to become diamond-liked carbon (DLC). It will be understood that DLC coatings having excellent tribological properties and relatively high thermal conductivity.

The DLC also can be formed directly onto metal foam or graphene with PVD and CVD. An example PVD method uses a solid carbon as graphite. Example PVD methods include but are not limited to arc, sputter, and laser vapor deposition methods and so forth.

To be sure, coating of DLC through CVD method uses a gas (a hydrocarbon such as methane, ethylene and so forth). The CVD method utilizes ant of radio-frequency (RF), direct current (DC) discharge, Penning ionization gauge (PIG), and self-discharge CVD—just to name a few.

The DLC coated can be any grade with different ratio of sp2 and sp3 bonded carbon. Additionally, the metal foam that coated with graphene or HOPG can be exposed to xenon difluoride gas for fluorination. A graphene layer embodiment, a first layer of a multilayer graphene embodiment, or graphite embodiment will form fluorographene.

A metal foam that is coated with graphene can be exposed to plasma of tetrafluoro carbon methane (CF4) or sulphur hexafluoride (SF6) or fluorine gas. The graphene, first layer of multilayer graphene, or graphite will form fluorographene. It will be understood that fluorographene is insulating for electricity, lower thermal conductivity (1% of graphene) and chemically inert. Fluorographene can reduce the surface energy of graphene, which making other organic matter, such polymer, elastomer easier to adsorb at the outer surface of a metal/graphene foam.

While some embodiments above disclose coating a metal foam with graphene or graphite, other embodiments contemplate coating the outer surfaces of a metal foam with different types of 2D materials (e.g., materials that are a single atom in thickness). Other example 2D can be directly coated to metal foam or metal foam/graphene composite to change the overall properties of composite. For example, hexagonal-Boron Nitride (h-BN) exhibits a unique combination of advantageous properties, including excellent electrical insulation, high thermal conductivity, highly elastic. A coating of h-BN makes the whole metal-foam/graphene/h-BN composite electrically insulating.

In another embodiment, transition-metal dichalcogenides (TMD) ($MoSe_2$, $MoS_2$, $NbSe_2$ and so forth) are another type of 2D material which are built with one layer of transition metal atoms sandwiched between two layers of chalcogen atoms. The TMD have properties of semiconductors with various bandgaps (e.g. $MoS_2$, 1.4 eV, $MoSe_2$, 1.1 eV, $WSe_2$=1.2 eV, $Nbse_2$=0 eV and so forth).

A metal foam that is coated first with graphene or metal foam alone can be exposed to a secondary CVD for coating of TMD. The CVD can be performed at roughly 650° C. using a variety of precursor materials, depending on the type of TMD to coated. For example, Sulphur and molybdenum oxide can be used as precursor for $MoS_2$ formation, while Selenium and Molybdenum oxide can be used for $MoSe_2$ formation, and Selenium and Tungsten oxide can be used for $WSe_2$ formation—just as an example.

Coating of TMD onto the metal foam/graphene will make the metal foam composite semi-conductive. TMD has its own bandgap, only adequate potential across the metal foam/graphene/TMD composite allowing it to be electrical conductive; else it would be having the properties as insulator for electricity.

The TMD, h-BN and Fluorographene or combination of TMD, h-BN and Fluorographene can be selectively coated on specific area of metal foam or metal foam/graphene composite to provide different property at different area.

In yet another embodiment, the metal foams created using various methods above can be used as a matrix for creating a graphene-based foam (e.g., graphene nanofoam). In sum, the metal foam is used as a sacrificial matrix or scaffolding upon which a graphene matrix is created.

In general, any composite of metal foam with any combination of HOPG, DLC, Graphene, Fluorographene, h-BN and TMDs can further processed to get rid of the metal foam upon which it was built.

In one example embodiment, a composite metal foam soaked into chemical etchant, such as acid, aqueous iron salts, ammonia persulfate or other similar compound to etch away the metal foam, leaving behind only graphene nanofoam or the foam with the combination of HOPG, DLC, Graphene, Fluorographene, h-BN and TMDs foam.

A catalyst nanoparticle can be dispersed onto the surface of graphene and gone through another CVD to fill any voids in some embodiments. A graphene based nanofoam has tremendous surface area and when incorporated into a casing such as a battery that is filled with an electrolyte. The electrolyte can fill the void in the graphene nanofoam. The extremely high contact area of electrode (graphene) for the electrolyte provides for high speed charging battery.

In other embodiments, a polymer elastomer can be used to fill voids of graphene nanofoam for electrical conductivity. Besides the strong mechanical strength of graphene the mechanical property of polymer and elastomer enhance this mechanical strength and increase elasticity.

In another embodiment, a graphene nanofoam can be used for hydrogen storage in a fuel cell. To be sure, physisorption of hydrogen onto graphene surface allows for steady release of hydrogen from graphene foam, which is important to prevent high pressure fluctuation in hydrogen feeding into fuel cells.

Figure 14:
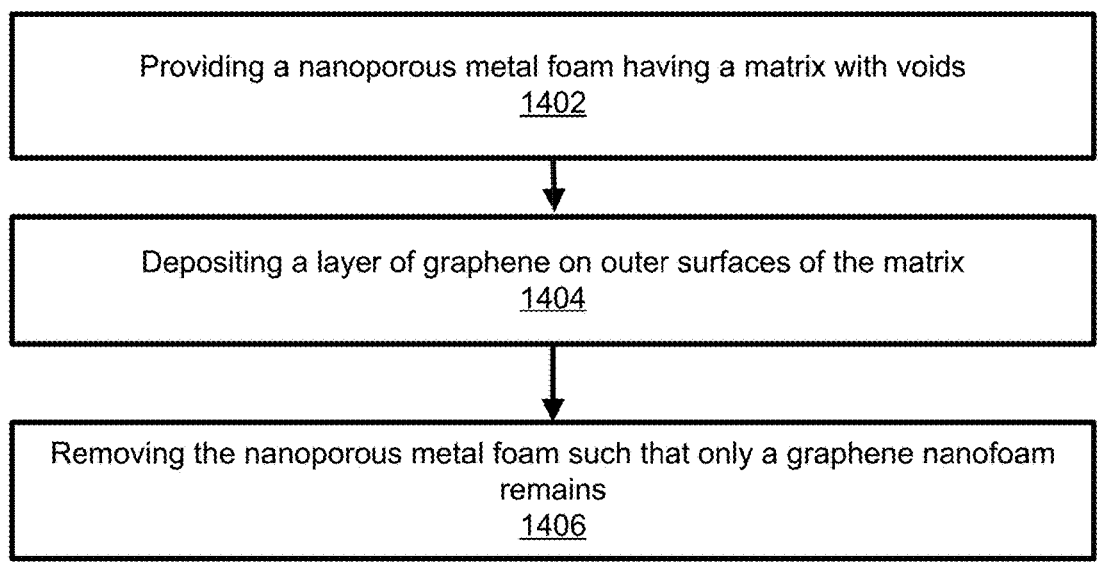
FIG. 14 is a flowchart of an example method of creating a graphene nanofoam in accordance with the present disclosure.

FIG. 14 illustrates an example method 1400 of creating a graphene nanofoam. The method generally includes a step 1402 of providing a nanoporous metal foam having a matrix with voids. The nanoporous metal foam can include any of the metal foams disclosed herein that are capable of receiving a graphene coating. The method also includes a step 1404 of depositing a layer of graphene on outer surfaces of the matrix, as well as a step 1406 of removing the nanoporous metal foam such that only a graphene nanofoam remains.

Other optional steps of filling voids of the graphene nanofoam to change the physical properties of the graphene nanofoam are also contemplated for use.

Figure 17:
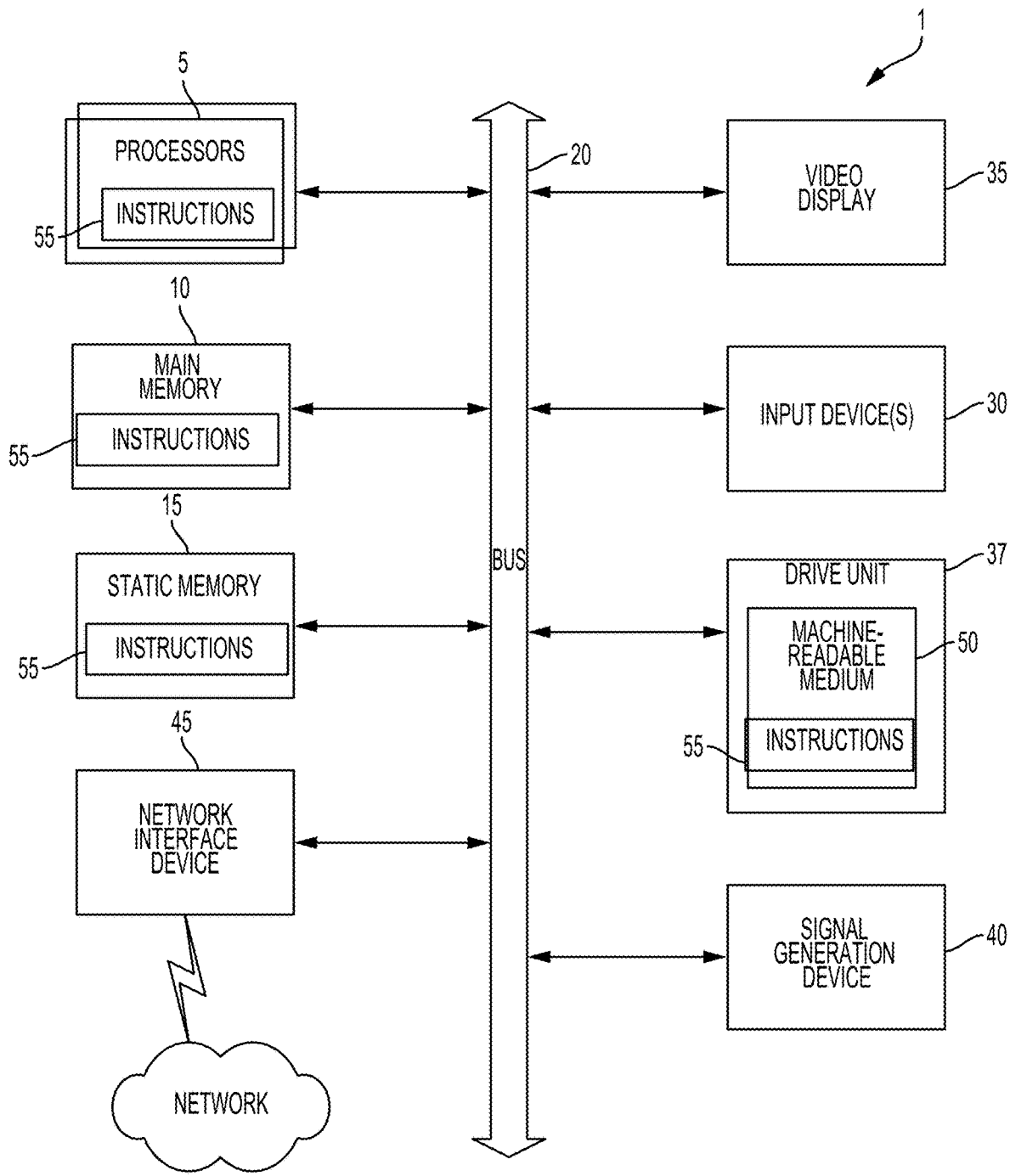
FIG. 17 is a schematic diagram of an example computer system that can be utilized to implement aspects of the present technology.

FIG. 17 illustrates an example computer system 1 that can be utilized to control the chemical vapor deposition machine and compression machine. That is, the computer system 1 can select thermal profiles to control the heating and cooling during graphene deposition.

The computer system 1, within which a set of instructions for causing the machine to perform any one or more of the methodologies discussed herein may be executed. In various example embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a robotic construction marking device, a base station, a personal computer (PC), a tablet PC, a set-top box (STB), a personal digital assistant (PDA), a cellular telephone, a portable music player (e.g., a portable hard drive audio device such as an Moving Picture Experts Group Audio Layer 3 (MP3) player), a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1 includes a processor or multiple processors 5 (e.g., a central processing unit (CPU), a graphics processing unit (GPU), or both), and a main memory 10 and static memory 15, which communicate with each other via a bus 20. The computer system 1 may further include a video display 35 (e.g., a liquid crystal display (LCD)). The computer system 1 may also include an alphanumeric input device(s) 30 (e.g., a keyboard), a cursor control device (e.g., a mouse), a voice recognition or biometric verification unit (not shown), a drive unit 37 (also referred to as disk drive unit), a signal generation device 40 (e.g., a speaker), and a network interface device 45. The computer system 1 may further include a data encryption module (not shown) to encrypt data.

The drive unit 37 includes a computer or machine-readable medium 50 on which is stored one or more sets of instructions and data structures (e.g., instructions 55) embodying or utilizing any one or more of the methodologies or functions described herein. The instructions 55 may also reside, completely or at least partially, within the main memory 10 and/or within the processors 5 during execution thereof by the computer system 1. The main memory 10 and the processors 5 may also constitute machine-readable media.

The instructions 55 may further be transmitted or received over a network via the network interface device 45 utilizing any one of a number of well-known transfer protocols (e.g., Hyper Text Transfer Protocol (HTTP)). While the machine-readable medium 50 is shown in an example embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like. The example embodiments described herein may be implemented in an operating environment comprising software installed on a computer, in hardware, or in a combination of software and hardware.

Not all components of the computer system 1 are required and thus portions of the computer system 1 can be removed if not needed, such as Input/Output (I/O) devices (e.g., input device(s) 30). One skilled in the art will recognize that the Internet service may be configured to provide Internet access to one or more computing devices that are coupled to the Internet service, and that the computing devices may include one or more processors, buses, memory devices, display devices, input/output devices, and the like. Furthermore, those skilled in the art may appreciate that the Internet service may be coupled to one or more databases, repositories, servers, and the like, which may be utilized in order to implement any of the embodiments of the disclosure as described herein.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms and a plural term may include its singular form. Similarly, a hyphenated term (e.g., "on-demand") may be occasionally interchangeably used with its non-hyphenated version (e.g., "on demand"), a capitalized entry (e.g., "Software") may be interchangeably used with its non-capitalized version (e.g., "software"), a plural term may be indicated with or without an apostrophe (e.g., PE's or PEs), and an italicized term (e.g., "N+1") may be interchangeably used with its non-italicized version (e.g., "N+1"). Such occasional interchangeable uses shall not be considered inconsistent with each other.

Also, some embodiments may be described in terms of "means for" performing a task or set of tasks. It will be understood that a "means for" may be expressed herein in terms of a structure, such as a processor, a memory, an I/O device such as a camera, or combinations thereof. Alternatively, the "means for" may include an algorithm that is descriptive of a function or method step, while in yet other embodiments the "means for" is expressed in terms of a mathematical formula, prose, or as a flow chart or signal diagram.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While specific embodiments of, and examples for, the system are described above for illustrative purposes, various equivalent modifications are possible within the scope of the system, as those skilled in the relevant art will recognize. For example, while processes or steps are presented in a given order, alternative embodiments may perform routines having steps in a different order, and some processes or steps may be deleted, moved, added, subdivided, combined, and/or modified to provide alternative or sub-combinations. Each of these processes or steps may be implemented in a variety of different ways. Also, while processes or steps are at times shown as being performed in series, these processes or steps may instead be performed in parallel, or may be performed at different times.

While various embodiments have been described above, it should be understood that they have been presented by way of example only, and not limitation. The descriptions are not intended to limit the scope of the invention to the particular forms set forth herein. To the contrary, the present descriptions are intended to cover such alternatives, modifications, and equivalents as may be included within the spirit and scope of the invention as defined by the appended claims and otherwise appreciated by one of ordinary skill in the art. Thus, the breadth and scope of a preferred embodiment should not be limited by any of the above-described exemplary embodiments.

What is claimed is:

1. A method of creating a porous metal foam, the method comprising:
    mixing an amount of a metallic powder with an amount of sacrificial particles in a specified ratio to create a mixture;
    applying pressure to the mixture that is sufficient to:
        compact the mixture;
        decompose or dissolve the sacrificial particles; and
        fuse the metallic powder into the porous metal foam;
    filling voids of the porous metal foam with a polymer; and
    implanting magnetic nanoparticles into the polymer.

2. The method according to claim 1, wherein the metallic powder comprises any of copper, nickel, tungsten, iron, platinum, cobalt, or any combinations thereof.

3. The method according to claim 1, wherein the metallic powder comprises any metallic alloy.

4. The method according to claim 1, wherein the sacrificial particles comprise any of potassium carbonate, magnesium oxide, sodium carbonate, a carbonate, a nitrate salt, any oxide salts, or any combinations thereof.

5. The method according to claim 1, wherein the sacrificial particles comprise any of a plastic ball in micro or nanoscale or polymer or any combination thereof.

6. The method according to claim 1, further comprising annealing the porous metal foam at an annealing temperature.

7. The method according to claim 1, further comprising removing remaining sacrificial particles using a chemical solution.

8. The method according to claim 1, further comprising magnetizing the porous metal foam by applying an electric current.

9. A method, comprising:
    providing a mold having a cavity;
    placing or direct three-dimensional printing of sacrificial particulates in the cavity of the mold in such a way that a matrix is formed having voids;
    applying pressure to the sacrificial particulates while the sacrificial particulates are inside the cavity;
    depositing a metal onto the sacrificial particulates using any of chemical vapor deposition, physical vapor deposition, or electroless or electrolytic plating;
    vaporizing the sacrificial particulates or diluting the sacrificial particulates with a chemical solvent to reveal a metal foam; and
    fusing the sacrificial particulates using any of heat or a chemical solvent.

10. The method according to claim 9, wherein a porosity of the metal foam is selected by varying the process pressure or the size or spacing of the sacrificial particulates.

11. The method according to claim 9, wherein when the sacrificial particulates comprise a polymer the metal is deposited as a coating on outer surfaces of the sacrificial particulates.

12. The method according to claim 9, wherein when the sacrificial particulates comprise a salt, the metal is deposited in such a way that the voids are necessarily filled with the matrix material, sacrificial particles, or with a gas.

13. The method according to claim 9, further comprising applying any of a vacuum and pressure within the cavity to enhance the depositing of the metal.

14. The method according to claim 9, further comprising:
    depositing a plurality of layers of the metal onto outer surfaces of the sacrificial particulates;
    forming a highly order pyrolytic graphite of the plurality of layers; and
    heat treating the highly order pyrolytic graphite to form a diamond-liked carbon coating.

15. The method according to claim 9, wherein the mold comprises at least one of metal, alloy, ceramic, or plastic having any geometric configuration, further wherein the combination of mold and metal foam to meet the claim, at least on the basis of the foam being made of a metal, which is thermally and electrically conductive.

\* \* \* \* \*